(12) United States Patent
Ohba

(10) Patent No.: US 6,559,880 B2
(45) Date of Patent: May 6, 2003

(54) SCAN-EXPOSURE DEVICE

(75) Inventor: Masahiro Ohba, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/813,979

(22) Filed: Mar. 22, 2001

(65) Prior Publication Data

US 2001/0026312 A1 Oct. 4, 2001

(30) Foreign Application Priority Data

Mar. 23, 2000 (JP) .................................... 2000-082406

(51) Int. Cl.⁷ ............................................. B41J 2/435
(52) U.S. Cl. ...................................................... 347/263
(58) Field of Search ................................. 347/234, 242, 347/245, 257, 262, 264, 263; 430/30; 369/102

(56) References Cited

U.S. PATENT DOCUMENTS 5,703,860 A * 12/1997 Fukunaga et al. .......... 369/102
6,165,658 A * 12/2000 Taff et al. .................... 430/30

* cited by examiner

Primary Examiner—Hai Pham
(74) Attorney, Agent, or Firm—Sughrue Mion, PLLC

(57) ABSTRACT

A scan-exposure device is provided wherein light beams becoming out of focus due to temperature changes is prevented and focus adjustment can be easily carried out, when a recording medium is subjected to scan-exposure by a plurality of light sources. A stage of an exposing head having a plurality of light source units provided thereon is supported by bases disposed at longitudinal direction opposite end portions thereof, and bases move in a sub-scanning direction which is the longitudinal direction of the stage when driven by a sub-scanning motor. The bases move relatively, in proportion to expansion or contraction of the stage, thereby preventing deformation of the stage due to temperature changes so that dislocation does not occur and light beams emitted from the light source units do not become out of focus due to deformation of the stage.

15 Claims, 5 Drawing Sheets

SCAN-EXPOSURE DEVICE

BACKGROUND OF THE INVENTION

1. Field of the Invention

The present invention relates to a scan-exposure device for scan-exposure of photosensitive materials such as printing plates with light beams emitted from light sources moving along a main-scanning direction or a sub-scanning direction.

2. Description of the Related Art

In some image exposing apparatuses, which expose photosensitive materials such as photosensitive planographic printing plates used for printing (hereinafter referred to as "printing plates"), or the like, semiconductor lasers or LEDs are used as light sources, and printing plates are subjected to scan-exposure with light beams emitted from the light sources. Further, in some image exposing apparatuses, a printing plate is wound around a peripheral surface of a rotating drum, and then a main-scanning of the printing plate is carried out by rotating the rotating drum in a predetermined direction, and a sub-scanning is carried out by moving light sources, disposed to face the peripheral surface of the rotating drum, in an axial direction of the rotating drum.

In some scan-exposure devices provided in such image exposing apparatuses, a plurality of light sources are assembled with a predetermined spacing on an exposing stage which is disposed so as to face a peripheral surface of a rotating drum with a longitudinal direction thereof being parallel to a sub-scanning direction which is an axial direction of the rotating drum. In these devices, a sub-scanning with a plurality of light beams at a time is carried out by moving the exposing stage in the sub-scanning direction. That is, some scan-exposure devices are provided with an exposing head having a plurality of light sources arrayed in a line on an exposing stage.

By the way, when a printing plate is subjected to a scan-exposure by using a plurality of light sources arrayed in a line, focus adjustment of light beams irradiated from the respective light sources is also required. Therefore, in this exposing head, when light sources are attached at an exposing stage, they are adjusted so that spots of light beams emitted from the respective light sources are aligned in a line, the light beams emitted from the respective light sources being focused.

Further, the light sources are assembled to the exposing stage so that distances between the light sources and the rotating drum are the same at opposite end portions of the exposing stage. Thus, in the scan-exposure device having the light sources arrayed in a line, a light beam emitted from any one of the plurality of light sources is focused on a printing plate wound around the rotating drum.

While, in an exposing head which scan-exposes a printing plate which is long in the sub-scanning direction, the exposing stage is also long. Therefore, a slight inclination or deformation of the exposing stage causes the light beams irradiating onto a printing plate to become out of focus.

Accordingly, in a scan-exposure device, highly accurate parts must be used for an exposing stage and for a mechanism which moves the exposing stage for scanning. Also, highly accurate adjustment at the time of assembling the exposing stage, and the like, are required.

Further, in a scan-exposure device, parts forming an exposing head expand or contract due to temperature changes. This causes light beams to become out of focus even when a highly accurate adjustment has been done at the time of assembly and this results in degradation of finishing quality, due to blur and the like, in an image formed on a printing plate.

In order to prevent light beams from becoming out of focus due to environmental changes such as temperature, a temperature control device such as a cooling device is required, and therefore production costs for the apparatus is increased. Particularly, since an exposing stage, in which light sources for exposing an image onto a printing plate and the like are arrayed in a line, is long, light beams are likely to become out of focus. Therefore, there is a need to prevent the light beams from becoming out of focus due to temperature changes. Also, adjustment needs to be facilitated at the time of assembly or when the light beams become out of focus.

SUMMARY OF THE INVENTION

In view of the aforementioned, an object of the present invention is to propose a scan-exposure device with an exposing head having a plurality of light sources arrayed in a line, in which focus adjustment of light beams is easily carried out and the extent to which light beams become out of focus due to temperature changes or the like is reduced.

A first aspect of the present invention is a scan-exposure device for irradiating a recording medium disposed on a support, the scan exposure device including: (a) a light source stage having opposite end portions and a plurality of light sources operable for producing light beams arrayed in a line for irradiating a recording medium disposed on the support; (b) a pair of bases, with one base supporting the stage in a vicinity of one end portion of the stage, and the other base supporting the stage in a vicinity of the other end portion; and (c) a positioning mechanism provided at each base, with each positioning mechanism operable for controlling distance between the recording medium and the stage independent of the other positioning mechanism.

A second aspect of the present invention is a scan-exposure device for irradiating a recording medium, the scan exposure device including: (a) a support for supporting a recording medium; (b) a plurality of light sources arrayed in a longitudinal direction of the support for irradiating the recording medium with light beams; (c) a stage provided so as to be movable in directions which are substantially parallel and substantially perpendicular to the longitudinal direction of the support, with the stage having the plurality of light sources fixed thereon and opposite end portions; (d) a base supporting the stage at each end portion thereof and movable in a direction substantially parallel to the longitudinal direction of the support; and (e) an adjusting mechanism operable for moving the stage toward and away from the recording medium on the support.

A third aspect of the present invention is a scan-exposure device for irradiating a recording medium while the recording medium is moving in a predefined direction, the scan-exposure device including: a light source stage having opposite longitudinal direction end portions and a plurality of light sources operable for emitting light beams, the light sources having a predetermined spacing along the longitudinal direction of the light source stage; bases provided for supporting the light source stage at the longitudinal direction opposite end portions thereof, and movable in a direction orthogonal to the predefined direction in which the recording medium moves; and a scan-moving device operable for moving the light source stage in the direction orthogonal to the predefined direction by moving one of the bases.

According to the present invention, longitudinal direction opposite end portions of a light source stage, having a plurality of light sources attached at predetermined positions thereon, are respectively supported by a pair of bases. These bases can respectively move in a scanning direction of the light sources at a time of scan-exposing.

A scan-moving device is attached to one of the bases, and as the scan-moving device moves the one of the bases in the scanning direction of the light beams, the light source stage moves in the scanning direction of the light beams.

Since the bases are separately attached to the light source stage, they can move relative to each other. Thus, for example, when the light source stage expands or contracts due to temperature changes, the bases move relative to each other so as not to cause deformation, or the like, of the light source stage.

Therefore, deformation of the light source stage can be prevented without using expensive cooling temperature control devices, and the light beams can irradiate appropriate positions on the recording medium.

Further, according to the present invention, distance adjusting devices are provided between the light source stage and the bases at the opposite end portions of the light source stage in order to enable the light source stage to move toward and away from the recording medium with respect to each of the bases, and to be retained at the position after being moved toward or away from the recording medium.

Thus, distances (spaces) between the recording medium and each of the longitudinal direction opposite end portions of the light source stage can be respectively adjusted, and this facilitates adjustment of distance between the light source stage and the recording medium and inclination of the light source stage with respect to the recording medium.

Furthermore, according to the present invention, distance measuring devices are provided at the longitudinal direction opposite end portions of the light source stage to enable detection of distances between the recording medium and the longitudinal direction opposite end portions of the light source stage.

This facilitates determining if the light source stage (i.e., light sources) is at an appropriate distance from the recording medium. In addition, distance and inclination of the light source stage with respect to the recording medium can be easily adjusted by moving the light source stage with the distance adjusting devices on the basis of the results of the measurements by the distance measuring devices.

As described above, by facilitating positioning (such as adjustment of distance and inclination) of the light source stage with respect to the recording medium, the light source stage can be appropriately positioned and assembled with respect to the recording medium even when accuracy in machining or assembly of parts thereof is relatively low. In addition, since the position of the light source stage can be adjusted with a periodic or arbitrary timing, image exposures can be carried out with appropriate focusing.

DESCRIPTION OF THE PREFERRED EMBODIMENTS

Figure 1:
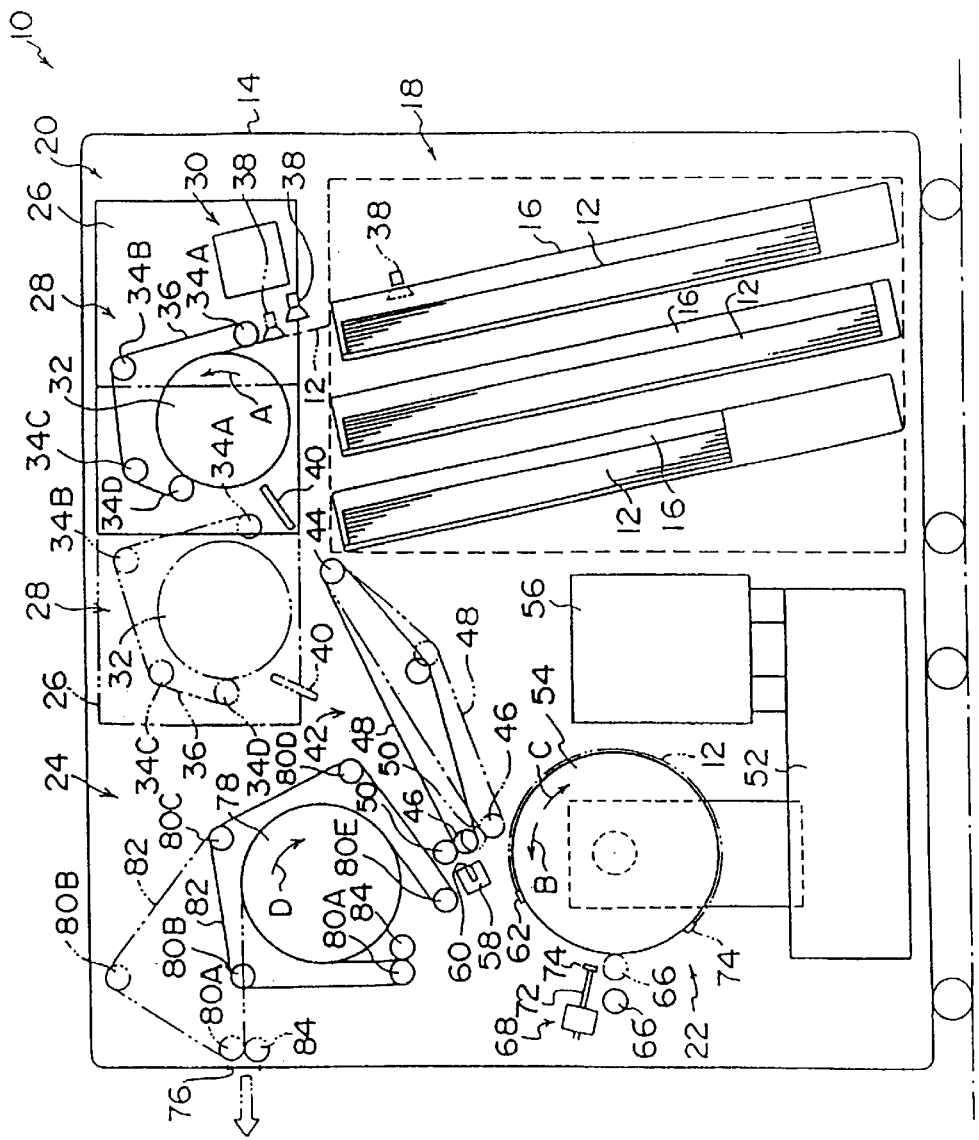
FIG. 1 shows a schematic structure of an image exposure apparatus applied to an embodiment of the present invention.

Referring to the figures, an embodiment of the present invention is explained below. FIG. 1 shows a schematic structure of an image exposing apparatus 10 applied to the present embodiment. A photosensitive material employed in this image exposing apparatus 10 is a photosensitive planographic printing plate which is formed by forming a photosensitive layer on a rectangular-thin-plate-like substrate (e.g. having about 0.3 mm thickness) made of aluminum or the like (referred to as "printing plate 12" hereinafter). The image exposing apparatus 10 performs scan-exposure on this printing plate with light beams which are modulated on the basis of image data. The printing plate 12 which has been subjected to image exposure at the image exposing apparatus 10 is then subjected to processing such as development and the like by an automatic developing apparatus (not shown) and the like.

In a machine frame 14 of the image exposing apparatus 10, a cassette loading section 18, a plate feeding-conveying section 20, a recording section 22, an ejecting buffer section 24, and the like are provided. The cassette loading section 18 is disposed at a lower right portion of the machine frame 14 as shown in FIG. 1, where a plurality of cassettes 16 respectively accommodating the number of printing plates 12 are loaded while slanted at a predetermined angle.

The image exposing apparatus 10 can process printing plates 12 of multiple sizes having different longitudinal or transverse dimensions, and cassettes 16 accommodate printing plates 12 of one of the different sizes being positioned so that the photosensitive layers of the printing plates 12 are oriented upward and one-ends thereof are positioned at a predetermined position. The cassettes 16 respectively accommodating printing plates 12 of one of the different sizes are loaded in the cassette loading section 18 with a predetermined spacing and so that one-ends of the printing plates 12 accommodated therein are positioned at substantially the same height.

The plate feeding-conveying section 20 is disposed above the cassette loading section 18, and the recording section 22 is disposed at a lower central portion of the apparatus, adjacent to the cassette loading section 18. An inverting unit 28 and a sheet feeder unit 30 are attached to a pair of side plates 26 (only one of them is shown in FIG. 1) which are provided at the plate feeding-conveying section 20.

The inverting unit 28 is provided with an inverting roller 32 having a predetermined outer diameter, and a plurality of small rollers 34 (e.g. four small rollers 34A, 34B 34C and 34D in the present embodiment) are provided around the inverting roller 32. The small rollers 34A through 34D are arranged along a path from the cassette loading section 18 side through a portion above the inverting roller 32 to the recording section 22 side, and an endless conveying belt 36 is trained over then. Thus, the endless conveying belt 36 is trained over a portion of the inverting roller 32 which lies over about a half of the periphery of the inverting roller 32 between the small roller 34A and the small roller 34D.

On the other hand, the sheet feeder unit 30 is provided with a plurality of suction cups 38 which suck upper end portions of the printing plate 12 in the cassette 16. The suction cups 38 are moved downward to face the upper end portions of the printing plate 12 in the cassette 16 loaded in the cassette loading section 18, and suck the printing plate 12. The sheet feeder unit 30 pulls out the printing plate 12 from the cassette 16 by moving the suction cups 38 which have sucked the printing plate 12 substantially upward, and inserts a leading edge of the pulled out printing plate 12 between the inverting roller 32 and the conveying belt 36. The chain double-dashed lines in FIG. 1 schematically illustrates movement positions of the suction cups 38.

In the inverting unit 28, the inverting roller 32 and the conveying belt 36 rotate in a direction in which the printing plate 12 is pulled out from the cassette 16 (direction of arrow A in FIG. 1). When the leading edge of the printing plate 12 is inserted between the inverting roller 32 and the conveying belt 36, the inverting unit 28 nips and conveys the printing plate 12 so as to pull out and train the printing plate 12 onto the inverting roller 32. Thus, the printing plate 12 is conveyed in a curved path and inverted, and the conveyance direction thereof is changed. The radius of the inverting roller 32 is such that the printing plate 12 is not broken or curled when curved on the inverting roller 32 (e.g. more than or equal to 100 mm).

As shown by the solid lines and the chain double-dashed lines in FIG. 1, the side plates 26 move horizontally according to the position of the cassette 16 from which the printing plate 12 is pulled out. Thus, the sheet feeder unit 30 can move horizontally together with the inverting unit 28 so that the suction cups 38 face the printing plate 12 in the desired cassette 16.

Further, the side plates 26 are provided with a guide 40 at a portion thereof below the small roller 34D. The printing plate 12 inverted by the inverting roller 32 is sent out from between the inverting roller 32 and the conveying belt 36 at the small roller 34D side, toward the guide 40.

A conveyor 42 is disposed above the recording section 22. The printing plate 12 sent out from the inverting unit 28 is guided by the guide 40 onto the conveyor 42. The guide 40 pivots along with the movement of the side plates 26 in order to always guide the printing plate 12 in a direction toward the conveyor 42. The small roller 34D at the recording section 22 side moves along with the movement of the side plates 26 to change the direction in which the printing plate 12 is sent out from the inverting unit 28. The small roller 34C moves so that a substantially constant tension is applied to the conveying belt 36 when the small roller 34D moves. The printing plate 12 is gently bent by the guide 40 and is sent out from the inverting unit 28.

The conveyor 42 is formed of a roller 44 disposed substantially below the guide 40, a roller 46 disposed above the recording section 22a and a conveying belt 48 trained around the rollers 44 and 46, and is inclined so that the roller 46 side is lower than the other side.

Figure 2:
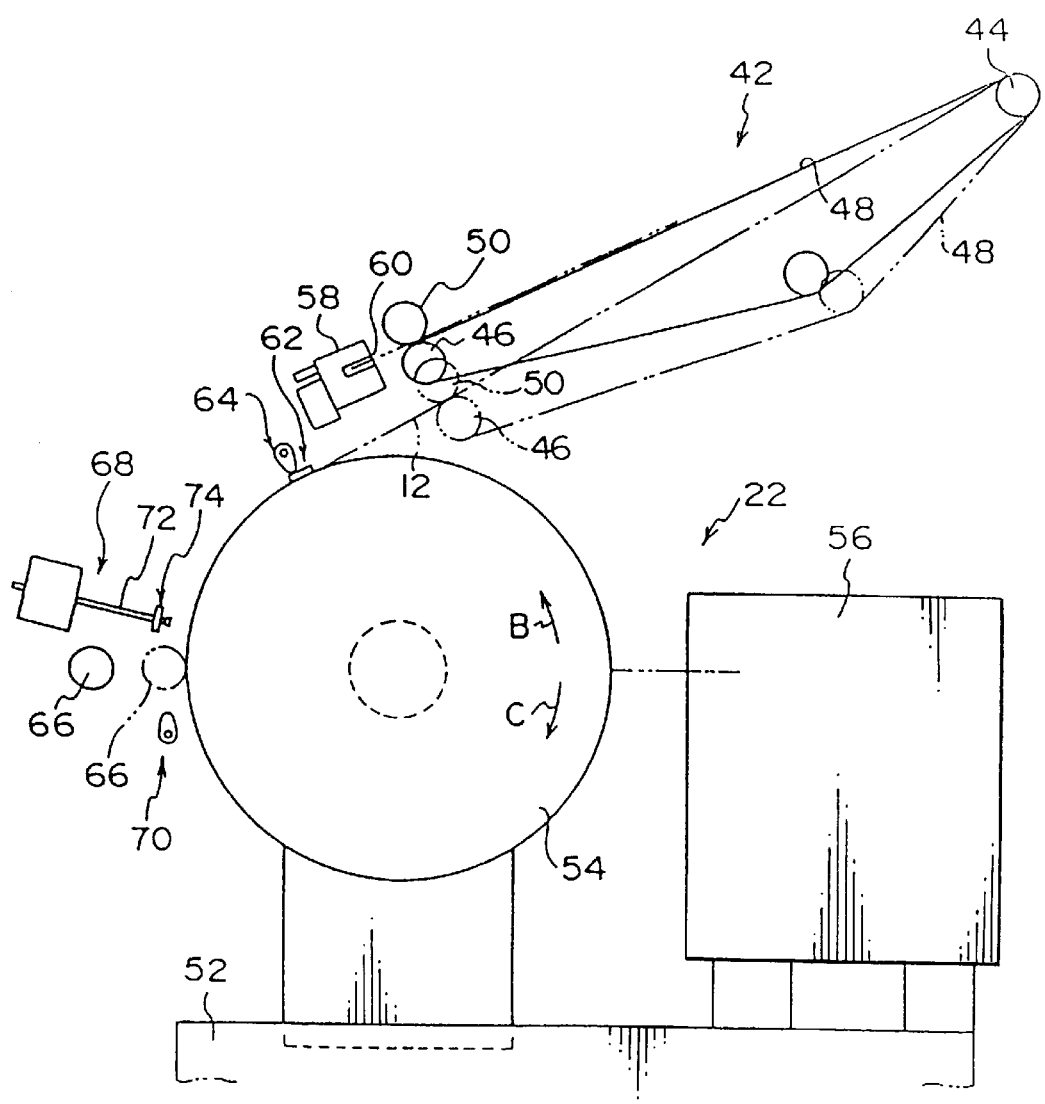
FIG. 2 shows a schematic structure of a recording section provided in the image exposure apparatus.

As shown in FIGS. 1 and 2, a roller 50 facing the roller 46 is disposed at the conveyor 42. The printing plate 12 sent onto the conveyor 42 is conveyed on the conveying belt 48, nipped between the rollers 46 and 50, and sent out from the conveyor 42.

In the recording section 22, a scan-exposure device 90 is formed of a rotating drum 54 disposed on a stand 52 and a recording head section 56 disposed to face the rotating drum 54. The scan-exposure device 90 is described in detail later.

Further, the image exposing apparatus 10 is provided with a puncher 58 facing the rollers 46 and 50 of the conveyor 42 above the rotating drum 54 of the recording section 22.

As shown in FIG. 2, the puncher 58 is formed with a holding mouth 60. The printing plate 12 is nipped by the rollers 46 and 50 of the conveyor 42 and the leading edge thereof is inserted and held in the holding mouth 60 of the puncher 58. The puncher 58 punches, for example, a notch for alignment at a predetermined position of the leading edge of the printing plate 12 inserted in the holding mouth 60. In order to punch the alignment notch at the predetermined position of the leading edge of the printing plate 12, the printing plate 12 is sent into the puncher 58 aligned, for example, on the conveyor 42.

The conveyor 42 can be pivoted around the roller 44 (as shown by the solid lines and the chain double-dashed lines in FIGS. 1 and 2) by a pivoting means (not shown). As a notch has been punched in the printing plate 12, the conveying belt of the conveyor 42 is driven in a reverse direction to pull out the leading edge of the printing plate 12 from the holding mouth 60 of the puncher 58, and then the conveyor 42 is pivoted to guide the leading edge of the printing plate 12 toward a predetermined position on the outer peripheral surface of the rotating drum 54. Then, the printing plate 12 is sent out to the recording section 22.

The rotating drum 54 provided at the recording section 22 is rotatably driven by a driving force from a driving means (not shown) at a predetermined rotation speed in a loading and exposing direction respectively of the printing plate 12 (a direction in which the printing plate 12 is loaded and exposed, i.e. direction of arrow B of FIGS. 1 and 2) and in a unloading direction of the printing plate 12 (a direction in which the printing plate 12 is unloaded, i.e. direction of arrow C of FIGS. 1 and 2), which direction is opposite to the loading and exposing direction.

As shown in FIG. 2, a leading edge chuck 62 is attached at a predetermined position on the outer peripheral surface of the rotating drum 54. In the recording section 22, when the printing plate 12 is loaded on the rotating drum 54, first, the rotating drum 54 is stopped in a position in which the leading edge chuck 62 faces the leading edge of the printing plate 12 being fed by the conveyor 42 (a printing plate loading position).

A loading cam 64 which faces the leading edge chuck 62 in the printing plate loading position is provided in the recording section 22. The loading cam 64 rotates and presses the leading edge chuck 62 to allow the leading edge of the printing plate 12 to be inserted between the leading edge chuck 62 and the peripheral surface of the rotating drum 54. By releasing the pressure of the loading cam 64, the leading edge of the printing plate 12 is nipped between the leading edge chuck 62 and the rotating drum 54, and is fastened to the rotating drum 54.

In the recording section 22, the printing plate 12 is wound around the rotating drum 54 by rotating the rotating drum 54 in the loading and exposing direction in a state in which the leading edge of the printing plate 12 is fixed at a predetermined position on the peripheral surface of the rotating drum 54 by the leading edge chuck 62. The rotating drum 54 is provided with a pin (not shown) projecting at a predetermined position on the peripheral surface thereof in the vicinity of the leading edge chuck 62. This pin serves to align the printing plate 12 on the rotating drum 54 by entering the notch punched in the leading edge of the printing plate 12.

In the recording section 22, a squeeze roller 66 is disposed in the vicinity of the peripheral surface of the rotating drum 54 and at a downstream side in the loading and exposing direction with respect to the printing plate loading position. The squeeze roller 66 moves toward the rotating drum 54 and presses the printing plate 12, being wound onto the rotating drum 54, against the rotating drum 54 so that the printing plate 12 closely contacts the peripheral surface of the drum 54.

Further, in the recording section 22, a trailing edge chuck attaching/removing unit 68 is provided at an upstream side in the loading and exposing direction of the rotating drum 54 with respect to the squeeze roller 66, and an unloading cam 70 is disposed at a downstream side in the loading and exposing direction with respect to the squeeze roller 66. A trailing edge chuck 74 is provided at a leading edge of a shaft 72, projecting toward the rotating drum 54, of the trailing edge chuck attaching/removing unit 68 so that the trailing edge chuck 74 is attachable to the rotating drum 54.

In the recording section 22, when the trailing edge of the printing plate 12 wound on the rotating drum 54 reaches a trailing edge chuck attaching/removing position, which position faces the trailing edge chuck attaching/removing unit 68, rotation of the rotating drum 54 is temporarily stopped and the trailing edge chuck 74 is attached at a predetermined position of the rotating drum 54. Thus, the trailing edge of the printing plate 12 wound on the rotating drum 54 is nipped and fastened between the trailing edge chuck 74 and the rotating drum 54.

Suction grooves (not shown) for holding, by suction thereof, the printing plate 12 wound on the rotating drum 54 are formed on the outer peripheral surface of the rotating drum 54, in order to keep the printing plate 12 fixed by the leading edge chuck 62 and the trailing edge chuck 74 in close contact with the peripheral surface of the rotating drum 54.

In the recording section 22, when the printing plate 12 has been wound on the rotating drum 54, the squeeze roller 66 is moved away from the rotating drum 54, and the printing plate 12 is irradiated with light beams from the recording head section. The light beams are modulated on the basis of image data, synchronously with the rotation of the rotating drum 54 while the drum is rotated in the direction of arrow B at a predetermined high rotating speed. Thus, the printing plate 12 is subjected to the scan-exposure based on the image data, and an image is formed at a predetermined position on the printing plate 12.

In the recording section 22, when the scan-exposure onto the printing plate 12 has been completed, the rotating drum 54 is stopped at the trailing edge attaching/removing position. Then, the trailing edge chuck 74 is removed from the rotating drum 54 to release the trailing edge of the printing plate 12 while the printing plate 12 is nipped between the squeeze roller 66 and the rotating drum 54. Then, the drum 54 is rotated in the unloading direction of the printing plate 12 (the direction of arrow C) to send out the printing plate 12 from between the squeeze roller 66 and the rotating drum 54.

As shown in FIG. 1, the ejecting buffer section 24 is provided above the recording section 22. As the rotating drum 54 rotates in the unloading direction of the printing plate 12 (the direction of arrow C), the printing plate 12 is sent out, with its trailing edge coming first, toward the ejecting buffer section 24. In the recording section 22, when the rotating drum 54 is rotated in the unloading direction of the printing plate 12 and the leading edge chuck 62 reaches the printing plate unloading position facing the unloading cam 70, the rotating drum 54 is stopped and the unloading cam 70 (see FIG. 2) is rotated to press the leading edge chuck 62 in this position. The nipping of the printing plate 12 between the leading edge chuck 62 and the rotating drum 54 is thereby released and the printing plate 12 is unloaded from the rotating drum 54.

The ejecting buffer section 24 is provided with an ejecting roller 78 provided in the vicinity of an ejection port 76 formed in the machine frame 14. A plurality of small rollers (e.g. five small rollers 80A, 80B, 80C, 80D and 80E) are arranged around the ejecting roller 78, and an endless conveying belt 82 is trained over the small rollers 80A through 80E. Thus, the conveying belt 82 is trained over a portion of the ejecting roller 78 which spans about a half to one third of the periphery of the ejecting roller 78 between the small roller 80A and the small roller 80D.

The small roller 80A is provided so as to project toward the squeeze roller 66 of the recording section 22, and a roller 84 is disposed to face the small roller 80A. The printing plate 12 sent out from the recording section 22 is nipped between the small roller 80A and the roller 84.

In the ejecting buffer section 24, the ejecting roller 78 is rotatably driven in a direction in which the printing plate 12 is pulled in (direction of arrow D) and pulls the printing plate 12 nipped between the small roller 80A and the roller 84 into a nip between the ejecting roller 78 and the conveying belt 82. Thus, the printing plate 12 is trained around the ejecting roller 78. At this time, in the ejecting buffer section 24, the ejecting roller 78 is stopped in a state in which the leading edge of the printing plate 12 (which was the trailing edge when sent out from the recording section 22) is nipped between the small roller 80A and the roller 84, and the printing plate 12 trained around the ejecting roller 78 is temporarily retained.

As illustrated by the chain double-dashed lines in FIG. 1, in the ejecting buffer section 24, the small roller 80A and the roller 84 are moved to a position in front of the ejection port 76. At this time, the small roller 80A and the roller 84 move together to guide the leading edge of the printing plate 12 toward the ejection port 76. While, the small roller 80B positioned above the small roller 80A moves along with the movement of the small roller 80A in order to apply a constant tension onto the conveying belt 82.

In the ejecting buffer section 24, the ejecting roller 78 is rotatably driven in a direction in which the printing plate 12 is sent out (a direction opposite to the direction of arrow D) at a rotating speed proportional to the conveying speed of the printing plate 12 in a processing apparatus such as an automatic developing apparatus, or the like, placed next to the ejection port 76. Thus, the printing plate 12 is sent out from the ejection port 76.

In the image exposing apparatus 10 having the above described structure, image data which is used to expose the printing plate 12 is input, then the size, the number, and the like, of the printing plates 12 to be subjected to image exposure are set, and starting of image exposure is instructed so that an image exposure process onto the printing plate 12 is started. These processings may be instructed via operation of switches on a control panel provided at the image exposure apparatus 10, or may be instructed via signals from an image processing apparatus, or the like, which outputs image data to the image exposing apparatus 10, and thereby instructs starting of the processing at the image exposing apparatus 10.

In the image exposing apparatus 10, when starting of the processing is instructed, the printing plate 12 of a specified size is taken out from the cassette 16 and loaded onto the conveyor 42, and is fed to the recording section 22. At this time, an alignment notch is punched in the printing plate 12 by the puncher 58.

In the recording section 22, the leading edge of the printing plate 12 is fixed on the rotating drum 54 by the leading edge chuck 62, the printing plate 12 is wound onto the rotating drum 54 while being squeezed by the squeeze roller 66, and the trailing edge of the printing plate 12 is fixed on the rotating drum 54 by the trailing edge chuck 74.

Consequently, the printing plate 12 is subjected to scan-exposure at the recording section 22 in which the printing plate 12 is irradiated by light beams based on the image data from the recording head section 56 while the drum 54 is rotated at a high speed. Thus, an image is formed at a predetermined portion on the printing plate 12.

The printing plate 12 having an image formed thereon is sent out from the recording section 22 to the ejecting buffer section 24. In the ejecting buffer section 24, the printing plate 12 is nipped between the conveying belt 82 and the ejecting roller 78 and wound onto the ejecting roller 78. Then, the leading edge of the printing plate 12 is directed toward the ejection port 76 and the ejecting roller 78 is rotated in a reverse direction. Thus, the printing plate 12 is sent out from the ejection port 76 at a predetermined conveying speed and is ejected from the image exposing apparatus 10.

By the way, in the scan-exposure device 90 formed by the rotating drum 54 and the recording head section 56 provided at the recording section 22, a scan-exposure of the printing plate 12 is carried out in such a manner that a main-scanning is performed by irradiating the printing plate 12 with light beams emitted from the recording head section 56 while the rotating drum 54, on which the printing plate 12 is wound, is rotated in the loading and exposing direction (direction of arrow B) at a predetermined rotating speed, and a sub-scanning is performed in an axial direction of the rotating drum, as described above. A mechanism for rotating the rotating drum 54 in the main-scanning direction may be a conventional known mechanism, and is not described in detail in the present embodiment.

Figure 3:
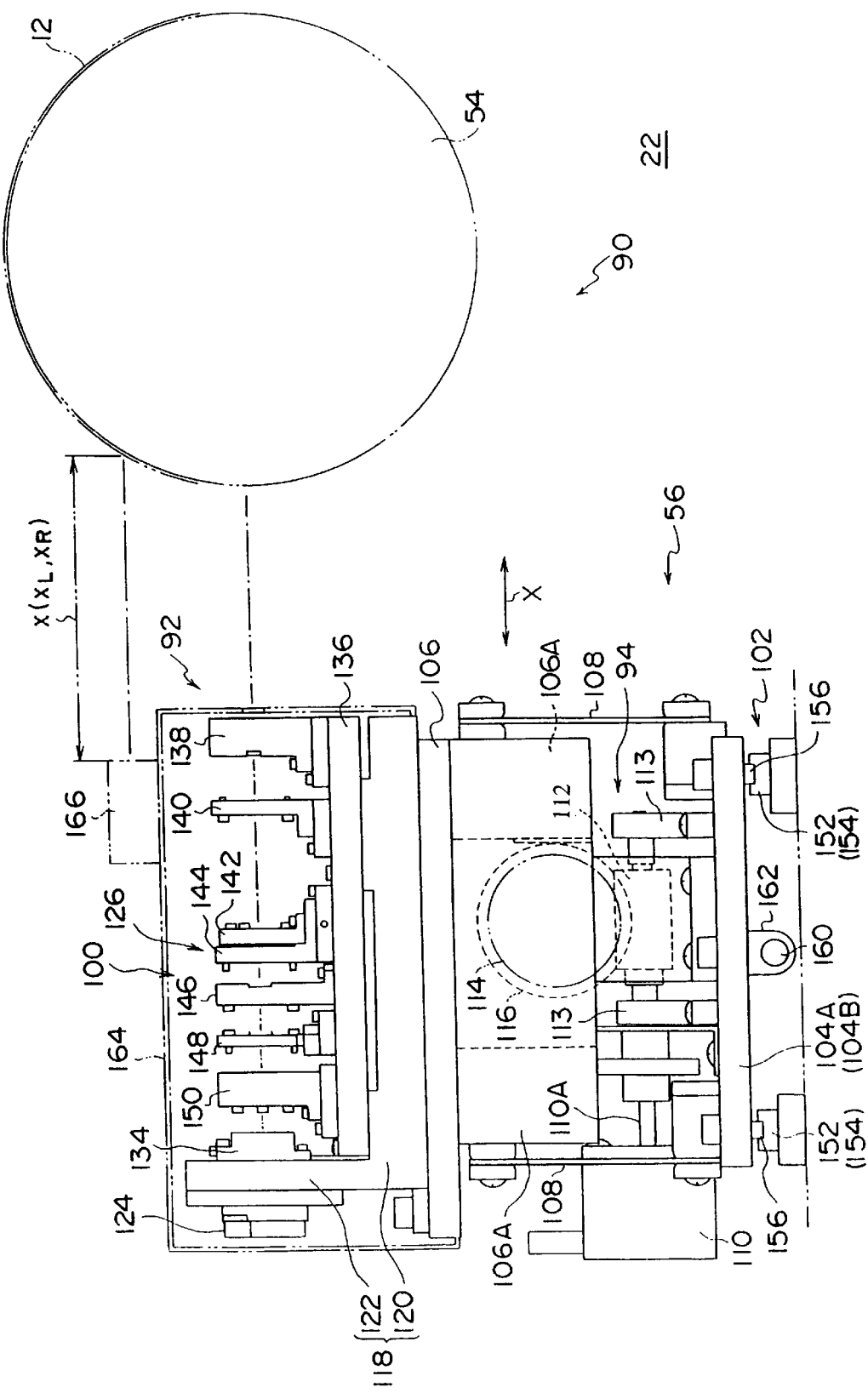
FIG. 3 shows a schematic structure of a scan-exposure device provided at the recording section, viewed from one end side in a sub-scanning direction.

As shown in FIG. 3, the recording head section 56 is provided with an exposing head 92 for emitting light beams onto the printing plate 12 wound on the rotating drum 54, and a sub-scanning mechanism 102 for moving the exposing head 92 in a sub-scanning direction (a direction perpendicular to the surface of the page in FIG. 3).

Figure 4:
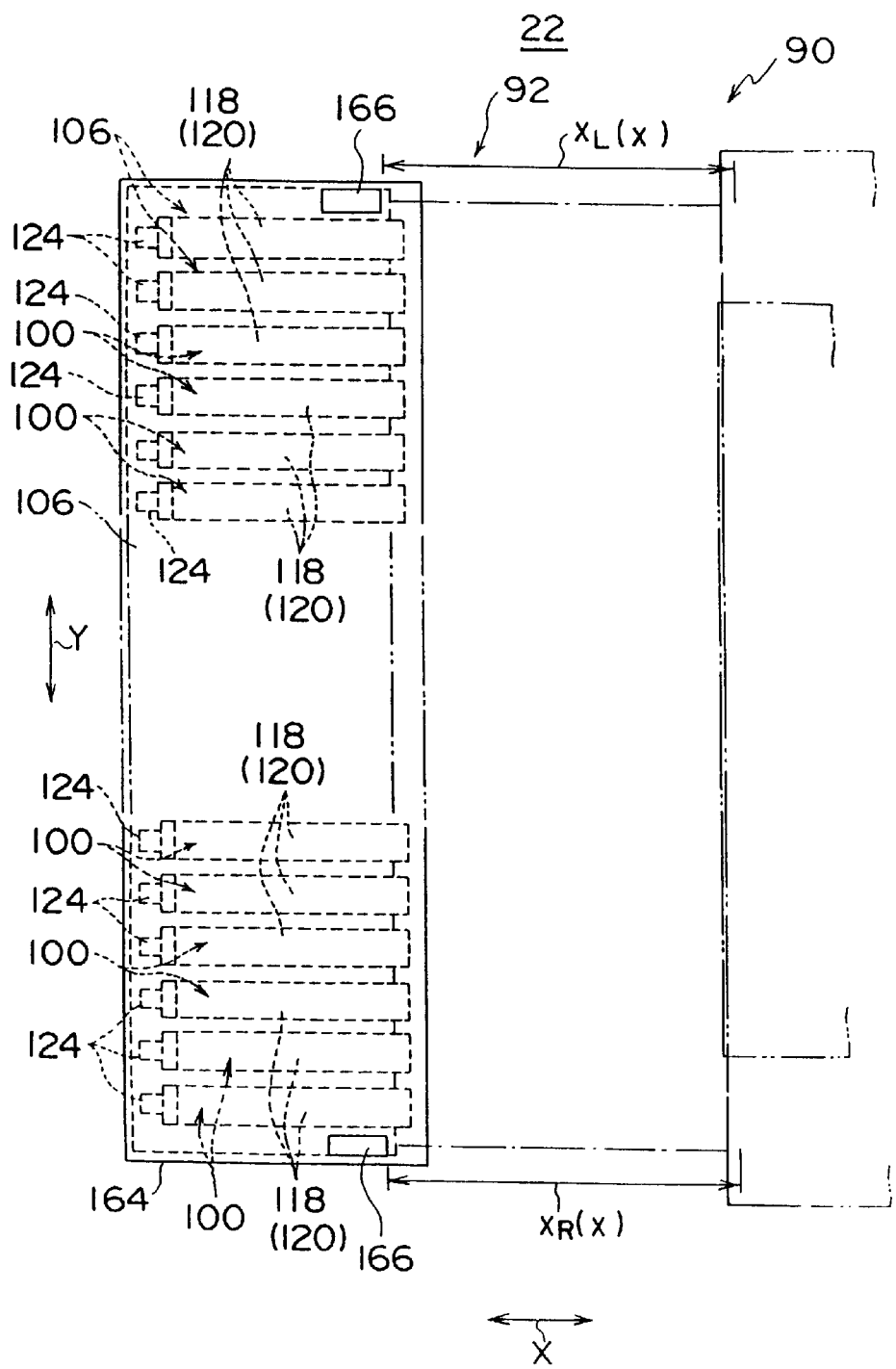
FIG. 4 is a schematic illustration showing positions of an exposing head and a rotation drum.

A plurality of light source units 100 are disposed on a stage 106 of the exposing head 92. As shown in FIG. 4, the stage 106 is formed in a long strip shape and is positioned so that the longitudinal direction thereof is parallel to the axial direction of the rotating drum 54 which is the sub-scanning direction (direction of arrow Y). The light source units 100 are attached to the stage 106 with a predetermined spacing in the longitudinal direction of the stage 106. In the present embodiment, for example, sixty-four light source units 100 are provided within an area of about 1200 mm in order to enable an image exposure on a maximum size printing plate 12.

As shown in FIG. 3, each of the light source units 100 is provided with a base 118 formed substantially in an L shape by a base portion 120 and a standing wall portion 122, and the base portion 120 is fixed at a predetermined position on the stage 106.

A light source assembly 124 and a plane-parallel plate holder 134 are attached to the standing wall portion 122, and an optical system assembly 126 is attached to the base portion 120 of each of the light source units 100. A laser diode, which is one of semiconductor light emitting devices and is used as a light source, and a collimator lens (none of them are shown) are incorporated in the light source assembly 124. Spacing between the laser diode and the collimator lens in the light source assembly 124 has been previously adjusted, therefore, by assembling the light source assembly 124 to the standing wall portion 122, the laser diode and the collimator lens are attached in predetermined positions of the light source unit 100.

A plane-parallel plate (not shown) is attached to the plane-parallel plate holder 134, and the plane-parallel plate holder 134 is attached to a surface of the standing wall portion 122 of the light source unit 100 at the optical system assembly 126 side, so as to face the light source assembly 124. Light beams emitted from the light source assembly 124 are transmitted through the plane-parallel plate in the plane-parallel plate holder 134 and emitted toward the optical system assembly 126 on the base portion 120.

The optical system assembly 126 is provided with a long fixing bed 136. On this fixing bed 136, a converging lens holder 138 to which a converging lens is assembled; a cylindrical lens holder 140 to which a convex cylindrical lens is assembled; an optically uniaxial crystalline holder 142 to which an optically uniaxial crystalline is assembled; a cylindrical lens holder 144 to which a concave cylindrical lens is assembled; a plane-parallel plate holder 146 to which plane-parallel plate is assembled; an aperture holder 148 to which an aperture is assembled; and a cylindrical lens holder 150 to which a convex cylindrical lens and a half-wave plate are assembled; are disposed in this order.

Thus, light beams emitted from the light source assembly 124 are transmitted through the plane-parallel plate, the half-wave plate, the cylindrical lens, the aperture, the plane-parallel plate, the cylindrical lens, the optically uniaxial crystalline, the cylindrical lens and the converging lens, to irradiate the printing plate 12 wound on the peripheral surface of the rotating drum 54. The light source units 100 are attached to the stage 106 with a predetermined spacing in a state in which the positions thereof are respectively adjusted so that light beams are focused and spot positions thereof are aligned in a line.

Figure 5:
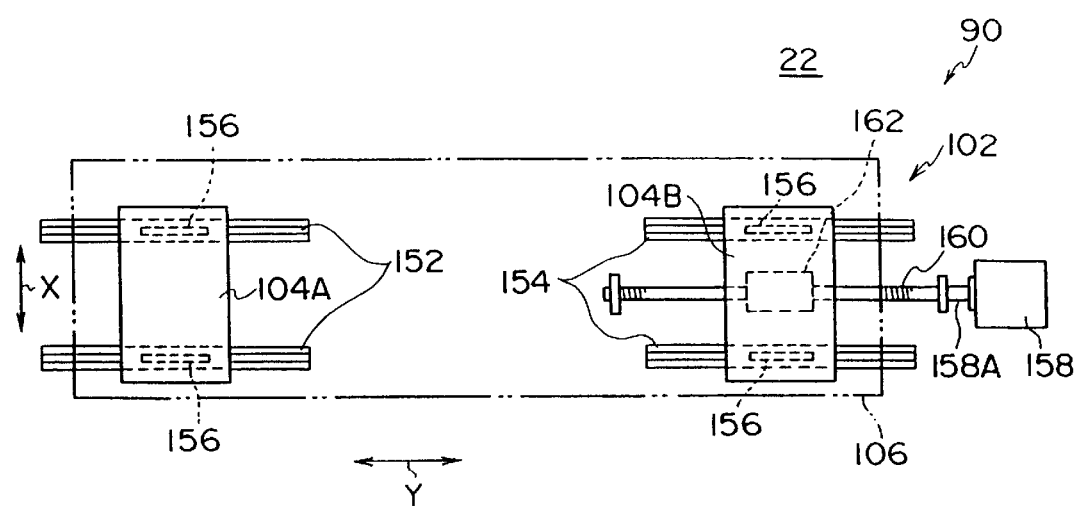
FIG. 5 is a schematic illustration showing a sub-scanning mechanism.

As shown in FIG. 5, bases 104A and 104B are provided at sub-scanning direction opposite end portions of the stage 106 so as to face each other.

A pair of guide rails 152 are disposed below the base 104A, and a pair of guide rails 154 are disposed below the base 104B. The guide rails 152 and 154 are respectively positioned so that longitudinal directions thereof are parallel to the sub-scanning direction (direction of arrow Y), and are fixed, for example, on the stand 52 (not shown in FIG. 5). In the present embodiment, the guide rail 152 facing the base 104A and the guide rail 154 facing the base 104B are separately provided, however, the guide rails may be a pair of guide rails.

As shown in FIGS. 3 and 5, sliders 156 are respectively attached on surfaces of the bases 104A and 104B facing the guide rails 152 and 154, in order to enable the bases 104A and 104B to move respectively in the sub-scanning direction (direction perpendicular to the surface of the page in FIG. 3).

As shown in FIG. 3, pairs of leg portions 106A and 106B are provided at end portions at the rotating drum 54 side and at a side opposite to the rotating drum 54 side of the stage 106 of the exposing head 92, respectively facing the bases 104A and 104B of the sub-scanning mechanism 102. In FIG. 3, the base 104A is shown, but an illustration of the base 104B side is omitted.

One-end portions of plate springs 108 are respectively coupled to end portions at the rotating drum 54 side and at a side opposite to the rotating drum 54 side of the bases 104A and 104B. Other-end portions of the plate springs 108 extend upward and are coupled respectively to the leg portions 106A and 106B. Thus, the stage 106 can move together with the bases 104A and 104B in the sub-scanning direction in a state in which the sub-scanning direction opposite end portions of the stage 106 are supported by the plate springs 108 and the stage 106 is spaced apart from the bases 104A and 104B via the plate springs 108.

The plate springs 108 can resiliently deform respectively in a direction in which the stage 106 moves toward and away from the rotating drum 54 (direction of arrow X). By this resilient deformation of the plate springs 108, the stage 106 can move in a direction (of arrow X) in which the stage 106 moves toward and away from the rotating drum 54. Since the bases 104A and 104B are provided at the sub-scanning direction opposite end portions of the stage 106 so as to face each other, the sub-scanning direction opposite end portions of the stage 106 can move relatively in the direction in which the stage 106 moves toward and away from the rotating drum 54.

As shown in FIG. 5, a sub-scanning motor 158 is provided at sub-scanning direction one end at the base 104B side of the sub-scanning mechanism 102. A feed screw is coupled to a driving shaft 158A of the sub-scanning motor 158. The feed screw 160 is disposed and rotatably supported between the guide rails 154 with the axial direction thereof being parallel to the sub-scanning direction.

A feed nut 162 is attached to the base 104B at the sub-scanning motor 158 side, and the feed screw 160 is screwed into the feed nut 162. Thus, as the feed screw 160 is rotated by the sub-scanning motor 158, the feed nut 162 as well as the base 104B move in the sub-scanning direction which is an axial direction of the feed screw 160. Since the base 104B is coupled to the stage 106 and the base 104A is coupled to the stage 106, the exposing head 92, which has the number of light source units 100 provided on the stage 106 thereof, moves in the sub-scanning direction while being supported by the bases 104A and 104B.

In the recording head section 56, sub-scanning by light beams emitted from the respective light source units 100 is carried out by moving the light source units 100 provided at the exposing head 92 so that each of the light source units 100 fills the space between one light source unit 100 and a neighboring light source unit 100.

As shown in FIG. 3, a positioning mechanism 94 is provided at each of the bases 104A and 104B. FIG. 3 shows the positioning mechanism 94 at the base 104A side, but an illustration of the positioning mechanism 94 at the base 104B is omitted.

Stepping motors 110 are respectively provided at the positioning mechanisms 94, and are respectively attached to the bases 104A and 104B. Worm gears 112 are respectively disposed at the bases 104A and 104B between the leg portions 106A of the stage 106. The worm gears 112 are disposed so that the axial directions thereof are parallel to the direction (of arrow X) in which the stage 106 moves toward and away from the rotating drum 54, and are axially supported via bearings 113 attached to the bases 104A and 104B.

Driving shafts 110A of the stepping motors 110 are coupled to the worm gears 112, and thus the worm gears 112 are rotated by the stepping motor 110.

Worm wheels 114 and eccentric cams 116 are respectively provided between the pairs of leg portions 106A and 106B on the bases 104A and 104B. The worm wheel 114 and the eccentric cam 116 rotate together while being supported by one of the bases 104A and 104B via a bracket (not shown).

The worm wheel 114 meshes the worm gear 112 and rotates as the worm gear 112 rotates.

The eccentric cam 116 rotates together with the worm gear around the axis of rotation which is offset from the center of the eccentric cam 116. That is, as the worm gear 114 rotates, the eccentric cam 116 rotates eccentrically. A peripheral surface of the eccentric cam 116 abuts the leg portion 106A at the rotating drum 54 side due to a spring force of the plate springs 108.

As the eccentric cam 116 rotates eccentrically, it pushes the leg portion 106A at the rotating drum 54 side toward the rotating drum 54, thereby the stage 106 moves toward the rotating drum 54 against the spring force of the plate springs 108. When the eccentric cam 116 rotates in a direction opposite to the direction in which it pushes the leg portion 106A, the stage 106 moves away from the rotating drum 54 due to the spring force of the plate springs 108 with the leg portion 106A abutting the eccentric cam 116.

Since the sub-scanning direction opposite end portions of the stage 106 can be independently moved by the positioning mechanisms 94 in the direction (of arrow X) in which the stage 106 moves toward and away from the rotating drum 54, the distance between the exposing head 92 and the rotating drum 54 and inclination of the exposing head 92 relative to the axis of the rotating drum 54 can be adjusted.

As shown in FIGS. 3 and 4, a cover 164, which entirely covers the light source units 100 on the stage 106, is attached to the exposing head 92. The cover 164 is open at the rotating drum 54 side or has emitting holes formed in a surface at the rotating drum 54 side, through which the light beams emitted from respective light source units 100 can pass.

Distance detection sensors 166 are provided at sub-scanning direction opposite end portions of the cover 164. The distance detection sensors 166 are respectively provided at sub-scanning direction opposite end portions above the positioning mechanisms 94. Further, the distance detection sensors 166 are oriented to the rotating drum 54 at the same height. That is, a line which connects the positions on the peripheral surface of the rotating drum 54, to which the distance detection sensors 166 are respectively oriented, is parallel to the axis of the rotating drum 54.

The distance detection sensor 166 is structured, for example, by a light emitting portion and a light receiving portion provided integrally, and can detect a distance x to a reflecting position on the rotating drum 54 by emitting light from the light emitting portion and receiving the light reflected from the peripheral surface of the rotating drum 54 by the light receiving portion. The distance detection sensors 166 may have any structure which can detect a distance to the rotating drum 54 with high accuracy.

In the scan-exposure device 90 structured as described above, the sub-scanning motor 158 is actuated synchronously with the rotation of the rotating drum 54 on which the printing plate 12 is wound, to move the base 104B in the sub-scanning direction, which, in turn, moves this base 104A and the exposing head 92 on the stage 106 supported by the base 104A in the sub-scanning direction. At this time, light beams are respectively emitted from the plurality of light source units 100 synchronously with the rotation of the rotating drum 54, and the printing plate 12 is subjected to scan-exposure.

The stage 106 of the exposing head 92 is long in the sub-scanning direction in order to expose a large sized printing plate 12. Therefore, it expands or contracts as the ambient temperature changes. At this time, if the longitudinal direction opposite end portions of the stage 106 are fixed by the base at a predetermined distance, the stage 106 is deformed and this deformation causes dislocation of the irradiating positions of light beams emitted from the light source units 100 in the main-scanning direction, or causes the light beams to become out of focus.

In contrast, in the scan-exposure device 90, the bases 104A and 104B, which support the sub-scanning direction opposite end portions of the stage 106, are not directly coupled and can move in the sub-scanning direction relative to each other. Therefore, when the stage 106 expands or contracts, the base 104A moves in the sub-scanning direction relatively to the base 104B, thereby preventing the deformation of the stage 106.

Thus, in the scan-exposure device 90, the light beams becoming out of focus or dislocation of the spot positions in the main-scanning direction due to changes in the ambient temperature can be prevented with certainty.

Further, in the scan-exposure device 90, when the exposing head 92 is assembled, it is necessary to position the stage 106 in parallel with the axis of the rotating drum 54 so that the irradiating positions of the light beams emitted from the respective light source units 100 attached on the stage 106 onto the printing plate 12 are aligned in a line which is parallel to the axis of the rotating drum 54.

That is, a distance between the exposing head 92 and the rotating drum 54 and an inclination of the exposing head 92 with respect to the axis of the rotating drum 54 need to be adjusted. In addition, adjustment of the distance between the exposing head 92 and the rotating drum 54 and the inclination of the exposing head 92 need to be carried out at a predetermined timing in order to prevent deterioration of the finished quality of an exposed image due to the light beams being out of focus.

The scan-exposure device 90 is provided with the distance detection sensors 166 at the sub-scanning direction opposite end portions thereof, and the distances between the rotating drum 54 and the sub-scanning direction opposite end portions of the exposing head 92 can be detected by the distance detection sensors 166. Thus, a distance between the exposing head 92 and the rotating drum 54 and whether the exposing head 92 is inclined with respect to the rotating drum 54 or not can be detected.

Further, the exposing head 92 is provided with the positioning mechanisms 94 at the sub-scanning direction opposite end portions thereof, and the sub-scanning direction opposite end portions can be moved relatively by the positioning mechanisms 94 in the direction (of arrow x) in which the exposing head 92 moves toward and away from the rotating drum 54.

By rotating the eccentric cams 116 with the stepping motors 110, the positioning mechanisms 94 can move the stage 106 in a direction in which the stage 106 moves toward and away from the rotating drum 54.

As shown in FIG. 4, for example, in this type of adjustment, the respective positioning mechanisms 94 is actuated so that a detected distance $X_R$ of one of the distance detection sensors 166 and a detected distance $X_L$ of the other of the distance detection sensors 166 are the same distance $X_O$ (i.e. $X_R=X_O$, $X_L=X_O$) while respective distances to the rotating drum 54 are detected by the distance detection sensors 166. Thus, the distances between the rotation drum 54 and the opposite end portions of the exposing head 92, and the inclination of the exposing head 92 with respect to the rotating drum 54 can be easily adjusted.

Therefore, adjustment of the exposing head 92 with respect to the rotating drum 54 at assembly as well as adjustment at the time of periodic maintenance can be easily carried out. Even when accuracy in assembling the parts forming the exposing head 92 is low, the exposing head 92 can be assembled with high accuracy with respect to the rotating drum 54.

Thus, costs for the parts forming the exposing head 92, costs for assembling the exposing head 92 or costs for maintenance of the exposing head 92 can be reduced.

Further, the position and inclination of the exposing head 92 with respect to the rotating drum 54 can be easily adjusted. In addition, since the distance detection sensors 166 enable checking if adjustment of the exposing head 92 position is needed or not, the exposing head 92 can always be positioned in an appropriate position with respect to the rotating drum 54.

In the scan-exposure device having the above described structure, printing plates 12 having high finishing quality can be obtained since the distance and inclination of the exposing head 92 with respect to the rotating drum 54 can be easily adjusted so that scan-exposure with light beams which are appropriately focused can always be carried out on the printing plates 12.

The present embodiment explained above illustrates an example of the present invention, and is not intended to limit the structure of the present invention. For example, the sub-scanning mechanism 102 can employ any structure in which one of the bases 104B or 104A supporting the exposing head 92 is moved in the sub-scanning direction. Further, the positioning mechanism 94 is not limited to the structure employing the stepping motor 110 and the eccentric cam 116, and can employ actuators of any structure in which the respective sub-scanning direction opposite end portions of the exposing head 92 can be separately moved in the direction in which the exposing head 92 moves toward and away from the rotating drum 54, and the opposite end portions can be retained in the positions after being moved.

Furthermore, although the scan-exposure device 90 in which the printing plate 12 is wound around the rotating drum 54 and the imaging apparatus 10 employing the scan-exposure device 90 are explained as an example in the present embodiment, the present invention may be applied to image exposing apparatuses of any structure including a printer, a plotter, a CTP, a DDCP, and the like, in which not only photosensitive planographic printing plates such as the printing plate 12 but also various types of recording media including photosensitive materials such as photographic film and photographic paper, and a photosensitive drum may be subjected to scan-exposure.

As explained above, according to the present invention, deformation of a light source stage having a plurality of light sources provided thereon along a moving direction thereof can be prevented with certainty even when the stage expands or contracts due to a temperature change or the like. Further, since the positions of a recording medium and the light source stage provided with the light sources can be easily adjusted, assembly costs thereof can be reduced and the light source stage can always be positioned in an appropriate position with respect to the recording medium. Therefore, the present invention has an excellent effect that light beams do not become out of focus when the recording medium is subjected to scan-exposure so that an image with high finishing quality can be formed.

What is claimed is:

1. A scan-exposure device for irradiating a recording medium disposed on a cylindrical support, the scan exposure device comprising:

(a) a light source stage having opposite end portions in a sub-scanning direction, which is a direction substantially parallel to the axial direction of the support, and a plurality of light sources operable for producing light beams arrayed in a line thereon for irradiating a recording medium disposed on the support;

(b) a pair of bases, with one base supporting the stage in a vicinity of one end portion of the stage, and the other base supporting the stage in a vicinity of the other end portion, each of the bases being coupled to the stage via a positioning mechanism, each positioning mechanism moving the corresponding end of the stage toward or away from the support in a direction substantially perpendicular to the sub-scanning direction independent of the other positioning mechanism; and (c) guide rails supporting the pair of bases by way of sliders attached to the bases, such that pair of the bases are movable, relative to one another, in the sub-scanning direction.

2. The scan-exposure device of claim 1, further comprising a device operable for detecting distance between a surface of the recording medium and the stage.

3. The scan-exposure device of claim 2, wherein the device is an optical sensor.

4. The scan-exposure device of claim 1, wherein each of the bases are coupled to the stage via resilient members.

5. The scan-exposure device of claim 4, wherein the resilient members are resiliently deformable in a direction substantially perpendicular to the line in which the light sources are arrayed.

6. The scan-exposure device of claim 5, wherein the resilient members comprise plate springs.

7. The scan-exposure device of claim 1, wherein the support for the recording medium has a drum shape and the stage extends in parallel with an axis of the drum.

8. A scan-exposure device for irradiating a recording medium, the scan exposure device comprising:

(a) a cylindrical support for supporting a recording medium;

(b) a plurality of light sources arrayed in a longitudinal direction of the support for irradiating the recording medium with light beams;

(c) a stage provided so as to be movable in directions which are substantially parallel and substantially perpendicular to the longitudinal direction of the support, with the stage having the plurality of light sources fixed thereon and opposite end portions in a sub-scanning direction, which is a direction substantially parallel to the axial direction of the support;

(d) a base supporting the stage at each end portion thereof and movable in a direction substantially parallel to the longitudinal direction of the support, the base being coupled to the stage via a positioning mechanism, the positioning mechanism moving the corresponding end of the stage toward or away from the support in a direction substantially perpendicular to the sub-scanning direction; and (e) guide rails supporting the bases by way of sliders attached to the bases, such that the bases are movable, relative to one another, in the sub-scanning direction.

9. The scan-exposure device of claim 8, wherein each base is coupled to the stage in a vicinity of the end portion of the stage corresponding to that base via a resiliently deformable coupling member.

10. The scan-exposure device of claim 9, wherein the coupling members are resiliently deformable in a direction substantially perpendicular to the longitudinal direction of the support.

11. The scan-exposure device of claim 8, further comprising a measuring device operable for measuring distance between the recording medium and the stage, wherein the adjusting mechanism moves the stage in the direction substantially perpendicular to the longitudinal direction of the support based on the measured distance.

12. The scan-exposure device of claim 11, wherein each end portion of the stage is independently movable relative to the other end portion in the direction substantially perpendicular to the longitudinal direction of the support.

13. A scan-exposure device for irradiating a recording medium while the recording medium is moving in a predefined direction, the scan-exposure device comprising:

a light source stage having opposite longitudinal direction end portions in a sub-scanning direction, and a plurality of light sources operable for emitting light beams, the light sources having a predetermined spacing along the longitudinal direction of the light source stage;

bases provided for supporting the light source stage at the longitudinal direction opposite end portions thereof, and movable in a direction orthogonal to the predefined direction in which the recording medium moves, each of the bases being coupled to the stage via a positioning mechanism moving the corresponding ends of the stage toward or away from the recording medium in a direction substantially perpendicular to the sub-scanning direction, independent of the other positioning mechanisms; and guide rails supporting a pair of the bases by way of sliders attached to the bases, such that the pair of the bases are movable, relative to one another, in the sub-scanning direction.

14. The scan-exposure device of claim 13, further comprising a distance adjusting device provided at each bases, operable for positioning the light source stage supported by the bases, along directions towards and away from the recording medium.

15. The scan-exposure device of claim 14, further comprising distance measuring devices operable for detecting a distance between the light source stage and the recording medium, attached at least at each of longitudinal direction end portion sides of the light source stage.

* * * * *